(12) United States Patent
Yang et al.

(10) Patent No.: US 7,869,549 B2
(45) Date of Patent: Jan. 11, 2011

(54) AUTOMATIC GAIN CONTROL SYSTEM WITH SELF-ADAPTIVE ATTACK AND DECAY TIME

(75) Inventors: Fang Yang, Shenzhen (CN); Shunbai Tang, Shenzhen (CN)

(73) Assignee: Shenzhen STS Microelectronics Co., Ltd., Shenzhen (CN)

( * ) Notice: Subject to any disclaimer, the term of this patent is extended or adjusted under 35 U.S.C. 154(b) by 685 days.

(21) Appl. No.: 11/115,437

(22) Filed: Apr. 27, 2005

(65) Prior Publication Data

US 2006/0034400 A1 Feb. 16, 2006

(30) Foreign Application Priority Data

Aug. 13, 2004 (CN) .......................... 2004 1 0056663

(51) Int. Cl.
H04L 27/08 (2006.01)
(52) U.S. Cl. ...................... 375/345; 375/294; 375/297; 375/311; 375/327
(58) Field of Classification Search ................ 375/345; 327/331, 332; 455/232.1; 330/279, 140
See application file for complete search history.

(56) References Cited

U.S. PATENT DOCUMENTS

| | | | |
|---|---|---|---|
| 4,486,771 A * | 12/1984 | Machida et al. | 348/228.1 |
| 4,489,281 A * | 12/1984 | Kiyono | 330/129 |
| 5,029,182 A | 7/1991 | Cai et al. | |
| 5,095,533 A | 3/1992 | Loper et al. | |
| 5,603,113 A | 2/1997 | De Loe, Jr. | |
| 5,724,652 A | 3/1998 | Graham et al. | |
| 5,825,239 A * | 10/1998 | Adal | 327/563 |
| 6,038,435 A | 3/2000 | Zhang | |
| 6,169,504 B1 * | 1/2001 | Park | 341/141 |
| 6,295,445 B1 | 9/2001 | Uesugi | |
| 6,420,934 B1 | 7/2002 | Butler et al. | |
| 6,445,233 B1 * | 9/2002 | Pinai et al. | 327/159 |
| 6,510,188 B1 | 1/2003 | Isaksen et al. | |
| 6,744,882 B1 | 6/2004 | Gupta et al. | |
| 6,782,063 B1 | 8/2004 | Stevenson et al. | |
| 6,816,013 B2 | 11/2004 | Kao | |

(Continued)

FOREIGN PATENT DOCUMENTS

JP 05083057 A 2/1993

OTHER PUBLICATIONS

Office Action with English Translation for Chinese Application No. 200410056663.1, mailing date Feb. 27, 2009, pp. 21.

*Primary Examiner*—Shuwang Liu
*Assistant Examiner*—Kabir A Timory
(74) *Attorney, Agent, or Firm*—Lisa K. Jorgenson; William J. Kubids

(57) ABSTRACT

A method of gain control by amplifying an input signal with a variable gain amplifier to generate an output signal where the gain of the variable gain amplifier is selected based upon a control signal presented at a control input of the variable gain amplifier. When the output signal is larger than the upper boundary, incrementally changing the magnitude of the control signal so as to reduce the gain of the variable gain amplifier in a step-wise linear fashion. When the output signal is smaller than the lower boundary, incrementally changing the magnitude of the control signal so as to increase the gain of the variable gain amplifier in a step-wise linear fashion.

19 Claims, 7 Drawing Sheets

U.S. PATENT DOCUMENTS

| | | |
|---|---|---|
| 6,836,229 B2 | 12/2004 | Gregoire |
| 6,862,327 B2 | 3/2005 | Van Sinderen |
| 6,885,851 B1 | 4/2005 | Miura |
| 2002/0113654 A1* | 8/2002 | Hart .......................... 330/279 |
| 2002/0186081 A1* | 12/2002 | Kawabe et al. ............. 330/137 |
| 2003/0179046 A1* | 9/2003 | Lin et al. .................... 330/254 |

* cited by examiner

AUTOMATIC GAIN CONTROL SYSTEM WITH SELF-ADAPTIVE ATTACK AND DECAY TIME

BACKGROUND OF THE INVENTION

1. Field of the Invention

The present invention relates, in general, to control systems, and, more particularly, to circuits, systems and methods for providing automatically gain control with self-adaptive attack and decay times.

2. Relevant Background

Automatic gain control (AGC) circuits are common components in a wide variety of analog and digital systems. For example, when reading signals from a disk surface the signal amplitude produced by the read head may vary significantly and benefits from automatic gain control to scale the signal magnitude before further signal processing. In communication systems, receivers, tuners and demodulators often require AGC processing of received signals to account for variations in the receive channel. AGC circuits are also used to prevent saturation in analog-to-digital converters. Other applications for AGC circuits are known. AGC circuit attempt to maintain relatively constant output signal amplitude over a range of signal input variations. This is typically achieved with an AGC which averages the output signal from the receiver and generates a feedback signal, referred to herein as an AGC control signal. The AGC control signal is coupled to control the gain of a variable gain amplifier.

AGC control systems have several characteristics which limit their use in a variety of applications. For example, AGC systems have a characteristic delay in its response to changes in the magnitude of the input signal. This means that the AGC control voltage remains constant for a short time after a change in the input signal level, after which the AGC control voltage follows the change to compensate for the level change. This delay is referred to as the "attack time" when describing the AGC system response to an input signal of increasing magnitude, and is referred to as a "decay time" when describing the AGC system response to an input signal of decreasing magnitude. The conventional AGC technology exhibits different or asymmetric attack and decay times. Normally, fast attack and slow decay are present.

FIG. 1 illustrates a conventional AGC circuit 100 consistent with practice in the prior art. In FIG. 1, a differential input identified as $V_{INP}$ and $V_{INN}$ is applied to the input of variable gain amplifier (VGA) 101. VGA 101 produces an amplified output ($V_{OUT}$) where the magnitude of the amplification is determined by the magnitude of a signal present on a control node of VGA 101. As shown in FIG. 1, conventional AGC circuits generate an AGC control voltage ($V_{AGC}$) by charging a capacitor 111 in a resistor-capacitor (RC) circuit. The AGC control voltage is coupled to a control node of a variable gain amplifier 101. In operation, when the output voltage is larger than a pre-determined reference level, level detector 105 is triggered and closes switch 107 for a specified duration. While switch 107 is closed, a constant current provided by currents source 113 charges capacitor 111. Usually capacitor 111 is implemented as an external capacitor because it requires a relatively large capacitance that is not practical to implement in an integrated fashion. The voltage on capacitor 111 is coupled to the control node of VGA 101 through buffer 109.

The attack time is determined by the rate at which the voltage on capacitor 111 can be increased. The increase step voltage on the capacitor in every charge cycle is described by:

$$\Delta V = \frac{(I \cdot t)}{C} = \frac{I}{(fC)}$$

where f is the signal frequency of $V_{INP}$ and $V_{INN}$. This equation illustrates that the attack time has a direct dependence on the signal frequency. In order to obtain an acceptable attack time, a large capacitance, which must typically be implemented externally, is required. Further, the lower the input signal frequency, the large the capacitor that is required.

It can also be seen in FIG. 1 that the voltage on capacitor 111 is only driven in one direction or sense. A resistor is provided to gradually and continuously drain current away and discharge capacitor 111. While this has the advantage of simplicity, the rate of current flow through the resistor changes continuously depending on the voltage across the capacitor. Further, while current is being applied through switch 107, a portion of the current is being drained off by the resistor. As a result, $V_{AGC}$ changes in a non-linear fashion that makes precise control more difficult.

In view of the above it is apparent that there is a need for improved systems, methods and circuits for automatic gain control.

SUMMARY OF THE INVENTION

Briefly stated, the present invention involves a method of gain control by amplifying an input signal with a variable gain amplifier to generate an output signal where the gain of the variable gain amplifier is selected based upon a control signal presented at a control input of the variable gain amplifier. When the output signal is larger than the upper boundary, incrementally changing the magnitude of the control signal so as to reduce the gain of the variable gain amplifier in a step-wise linear fashion. When the output signal is smaller than the lower boundary, incrementally changing the magnitude of the control signal so as to increase the gain of the variable gain amplifier in a step-wise linear fashion. The present invention also includes circuits for implementing the method and systems incorporating circuits for implementing the method.

DETAILED DESCRIPTION OF THE PREFERRED EMBODIMENTS

The present invention is illustrated and described in terms of a particular circuit implementation of an automatic gain control. While the present invention will typically be implemented as a part of an integrated circuit (IC), it is contemplated that the present invention may be implemented as discrete component, as a stand-alone IC, or as part of a system on chip (SOC) or multi-chip system.

Figure 1:
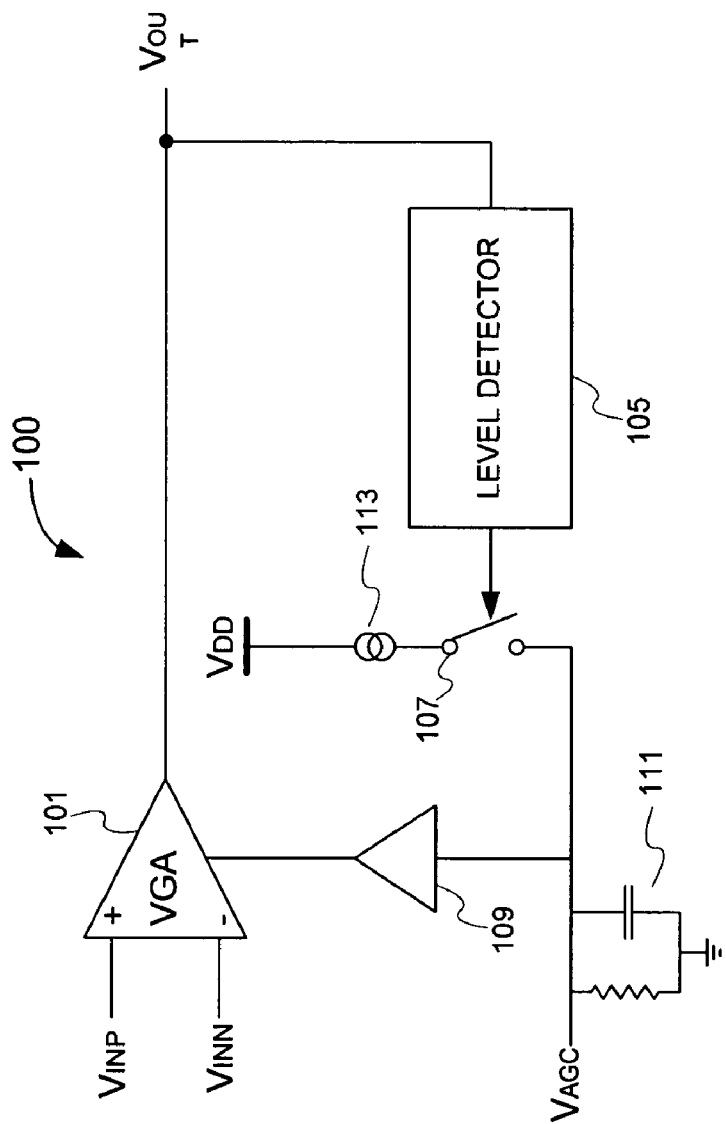
FIG. 1 shows an a prior art automatic gain control circuit.
Figure 2:
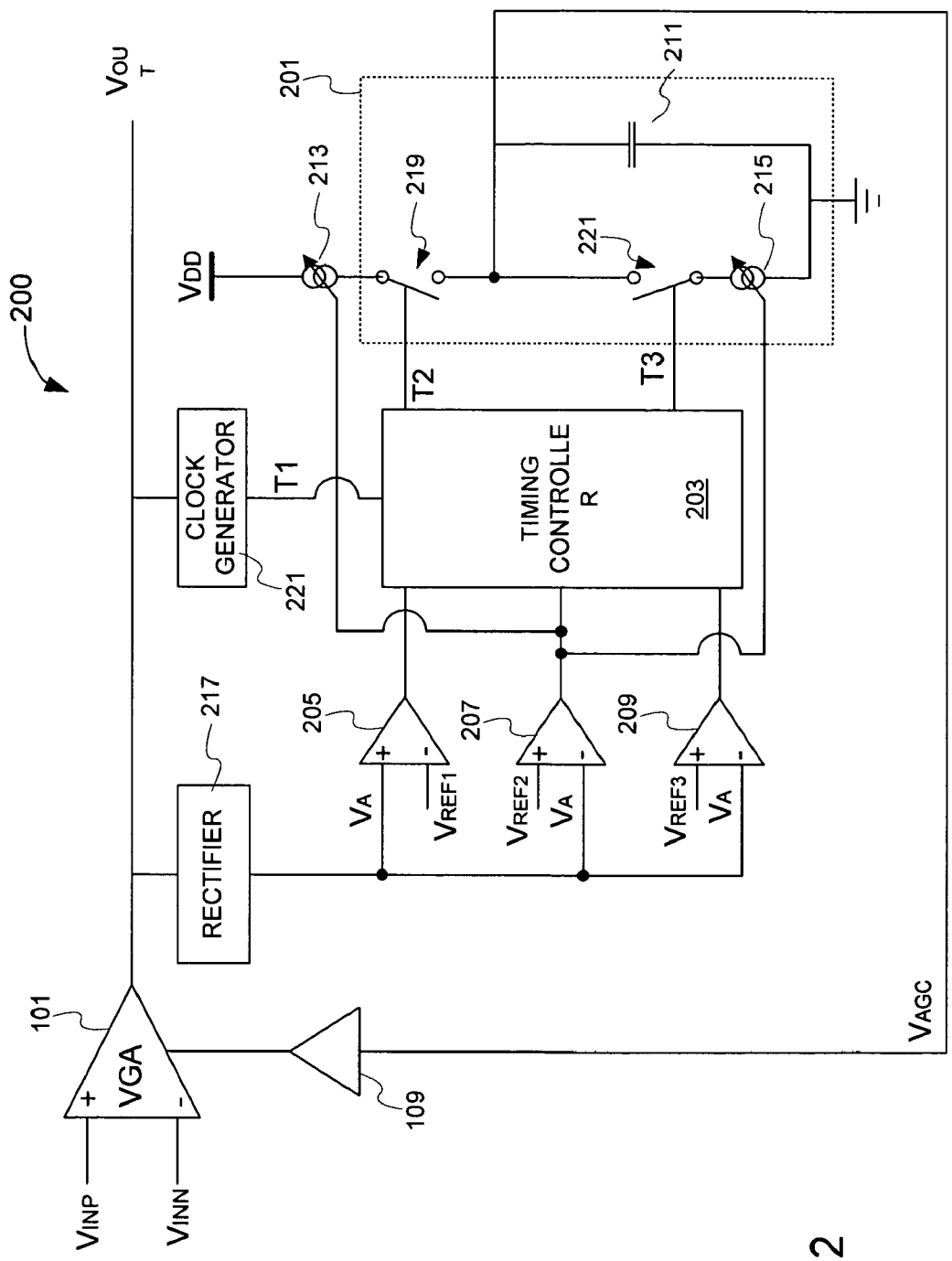
FIG. 2 shows an automatic gain control circuit in accordance with the present invention.

FIG. 2 illustrates an exemplary implementation in which the AGC control voltage ($V_{AGC}$) is generated by a charge pump 201 that is driven by a timing controller 203. Clock generator 221 generates a clock pulse T1 that is synchronized with the frequency of the $V_{OUT}$ signal. Charge pump 201 charges capacitor 211 by applying pulses T2 and discharges capacitor 211 by applying pulses T3. In general, the operating time of the charge pump 201 is relatively short and so the capacitor 211 can be small as compared to capacitor 111 shown in FIG. 1. This allows capacitor 211 to be implemented as an integrated device in some instances. The instantaneous gain of variable gain amplifier 101 is determined by the $V_{AGC}$ signal as applied through buffer 109.

Charge pump behavior is determined by the reference voltage values $V_{REF1}$, $V_{REF2}$ and $V_{REF3}$. Rectifier 217 rectifies the $V_{OUT}$ signal to produce a signal named $V_A$ in the illustrations. In the particular examples, $V_A$ is coupled to the inverting input of comparator 207 and 209, and coupled to the non-inverting input of comparator 205. $V_{REF1}$ is coupled to the inverting input of comparator 205, $V_{REF2}$ is coupled to the non-inverting input of comparator 207 and $V_{REF3}$ is coupled to the non-inverting input of comparator 209. $V_A$ is compared to $V_{REF1}$ by comparator 205, $V_{REF2}$ by comparator 207 and $V_{REF3}$ by comparator 209.

While $V_A$ is between $V_{REF1}$ and $V_{REF3}$, the output voltage $V_{OUT}$ is close to the desired value and so no gain adjustment is required. In this state, the charge pump 201 does not operate. Timing controller 203 produces signals T2 and T3 so as to keep switches 219 and 221 in an open state. Accordingly, capacitor 211 is neither charged nor discharged and $V_{AGC}$ remains substantially constant. Consequently, the AGC loop gain remains substantially constant.

When $V_A$ goes to a level outside of the "dead zone" defined by $V_{REF1}$ and $V_{REF3}$, the output voltage $V_{OUT}$ has deviated from the desired value and so gain adjustment is required. In the particular example, an increase in $V_A$ above $V_{REF1}$ causes the output of comparator 205 to transition from a logic LOW to a logic HIGH, and a decrease in $V_A$ below $V_{REF3}$ will cause the output of comparator 209 to transition from a logic LOW a logic HIGH. Timing controller 203 is then enabled to generate pulses T2 or T3 that close switches 219 or 221.

During charging, magnitude of the current supplied to capacitor 211 with each pulse of T2 is determined by variable current source 213. During discharging, magnitude of the current removed from capacitor 211 with each pulse of T3 is determined by variable current source 215. In the particular example, variable current sources 213 and 215 are under control of the output of comparator 207. Preferably, as the magnitude of the difference between $V_A$ and $V_{REF2}$ becomes larger, current sources 213/215 are controlled so as to increase the rate at which capacitor 211 is charged/discharged. In this manner the charge pump intervention is proportional to the difference between $V_A$ and $V_{REF2}$. When $V_A$ is close to $V_{REF2}$, charge pump current is small and the variation (increment or decrement) of $V_{AGC}$ is small as well. When $V_A$ differs significantly from $V_{REF2}$, the charge pump current is high and the increments of increase and decrease in $V_{AGC}$ are large as well. In a particular example, when charge pump 201 is operating it charges with a pulse of T2 or discharges with a pulse of T3 twice in each cycle of T1. The change in $V_{AGC}$ with each pulse of T2/T3 is described by:

$$\Delta V_{AGC} = \frac{I \cdot t}{C}$$

where t is the T2/T3 pulse width, I is the current magnitude of current source 213/215, and C is the value of capacitor 211. Unlike the prior circuit shown in FIG. 1, the operating time or pulse width of the T2/T3 pulses is fixed by the clock generator 221 and timing controller 203. Hence, each pulse will result in a substantially equal change in $V_{AGC}$, irrespective of the frequency of the input signal. However, T2/T3 may pulse at a wide range of rates and pulse widths to meet the needs of a particular application. The pulse width should be long enough to provide sufficiently rapid charge/discharge of capacitor 211 but at the same time short enough to provide adequately small steps each time T2/T3 are pulsed. Smaller steps provide greater granularity in the control of $V_{AGC}$. In a particular example, the charge time T2 is set to near the discharge time T3. As a result, the attack time is substantially equal to the release time.

In the example of FIG. 2, the attack time and decay time (also referred to as a release time) that are substantially equal is provided. The measured attack/decay time achieved by a particular implementation is dependent on the input magnitude because the system undergoes a continuous control action and the charge/discharge time of charge pump 211 is regulated to the same value even though the input signal frequency may vary.

It will be recalled that in the prior art FIG. 1, when the input frequency was low, the quantity of charging current added to capacitor 111 each cycle was much larger than is the quantity added during each cycle of a higher frequency input signal. As a result, in order to achieve sufficiently small voltage increments in $V_{AGC}$, a large external capacitor was required for low frequency operation. In accordance with the present invention, since the pulse width of each T2/T3 pulse can be made very short and is independent of the input signal frequency, capacitor 211 (shown in FIG. 2) can be made quite small as compared to capacitor 111 in FIG. 1.

For a case in which there are two T2/T3 pulses per clock, and therefore two incremental steps in the change of $V_{AGC}$ each clock pulse, for a given change in $V_{AGC}$ (i.e., a $V_{AGC}$ change from $V_{AGC1}$ to $V_{AGC2}$) the attack time (or decay time) can be determined from:

$$t_{attack} = t_{decay} = \frac{|V_{AGC2} - V_{AGC1}|}{2\Delta V_{AGC}}(T_S)$$

where Ts is the signal cycle (i.e., the period for T2/T3). From the above equation it is apparent that the decay time can be made substantially equal to the attack time for a given input signal because the current is determined by the input signal amplitude, not the input signal frequency. Moreover, the charge pump solution of the present invention allows control over both the rate of increase in $V_{AGC}$ as well as the rate of decrease in $V_{AGC}$.

The above equation also shows that the attack or decay time is a multiple "n" of the signal cycle where "n" is an integer indicating the number of T2/T3 pulses. In other words, the $V_{AGC}$ naturally increases or decrease in a step-wise linear fashion rather than prior solutions in which it was difficult or impossible to cause each increment to change $V_{AGC}$ by a uniform amount.

Figure 3:
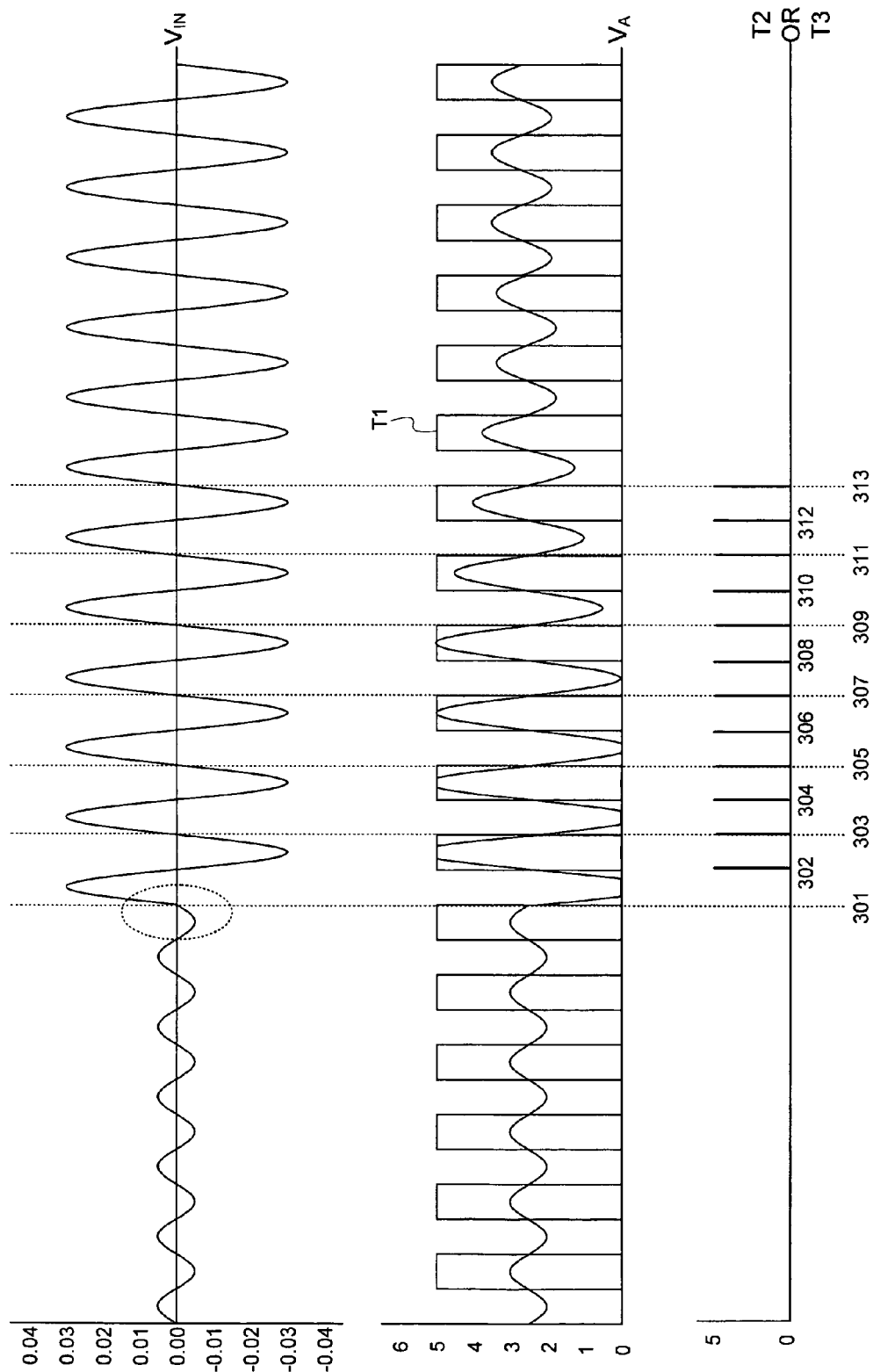
FIG. 3 shows waveforms illustrating the operation of a timing generator component of an automatic gain control circuit in accordance with the present invention.

FIG. 3 shows waveforms illustrating the operation of a timing controller 203. The three waveforms shown in FIG. 3 are aligned in time which is represented on the horizontal axis. The vertical axes represent voltage with exemplary voltage levels indicated on the axes for relative comparisons. FIG. 3 illustrates a situation in which the magnitude of $V_{IN}$ increases from a peak-to-peak value of about 2.5 mV to a peak to peak value of about 30 mV as shown at time point 301. Charging pump 201 functions to quickly and accurately change the gain of VGA 101 so that $V_{OUT}$ experiences little amplitude variance. The waveform labeled $V_A$ shows the rectified $V_{OUT}$, the waveform labeled T1 is illustrated as a square-wave superimposed over the $V_A$ waveform. It can be seen that T2/T3 pulses are synchronized with the $V_A$ waveform.

After time point 301, $V_A$ increases or decrease in magnitude such that it is outside of the window defined by $V_{REF1}$ and $V_{REF3}$. Consequently, current source 213 or 215 is activated, and timing controller 203 begins to generate T2 or T3 pulses. The determination of whether a T2 or T3 pulse is generated is determined by whether $V_A$ is larger than desired, indicating a need to reduce gain, or $V_A$ is smaller than desired, which indicates a need to increase gain.

At about time point 302 timing controller 203 beings to generate T2 or T3 pulses at times 302-313 as shown in the lower waveform of FIG. 3. In FIG. 3 the T2/T3 pulses are generated on the falling edge of the T1 clock, however, any convenient arrangement for generating one ore more T2/T3 pulses each clock cycle may be used. FIG. 3 illustrates that $V_A$ increases in magnitude immediately after $V_{IN}$ increases in magnitude to the point of clipping at the power supply limits. With in a few cycles, however, $V_A$ decreases in magnitude as the gain of VGA 101 is incrementally reduced over time periods 302-313. After time point 313 $V_A$ has been reduced to the point that it is within the upper and lower limits set by $V_{REF1}$ and $V_{REF3}$, at which time timing controller ceases generating T2 or T3 pulses.

Figure 4:
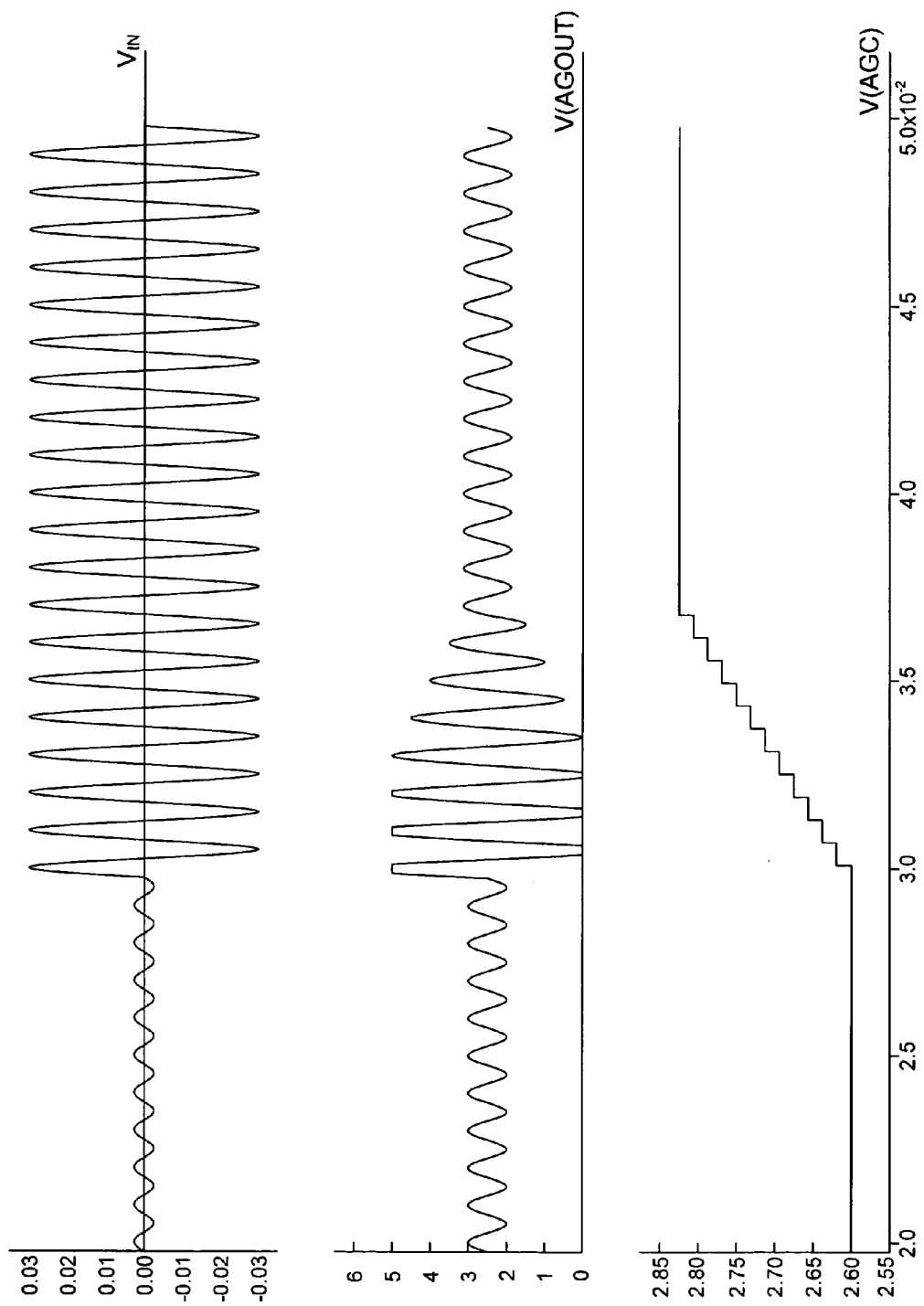
FIG. 4 shows waveforms illustrating attack time response of an automatic gain control circuit in accordance with the present invention.

FIG. 4 shows simulated waveforms illustrating attack time response of an automatic gain control circuit in accordance with the present invention with a $V_{IN}$ frequency of 1 kilohertz in an "attack" example where $V_{IN}$ increases from a peak value of about 2.5 mV to a peak value of about 30 mV as in the example of FIG. 3. In FIG. 4, $V_{OUT}$ is illustrated rather than $V_A$. In FIG. 4, $V_{AGC}$ generated is illustrated demonstrating how it increases in a step-wise linear fashion with two increments per clock cycle in the specific implementation. Each increment is substantially equal in magnitude to each other increment, and there is no discernable non-linear decay or discharge that affects the $V_{AGC}$ level. Once the timing controller 203 is deactivated $V_{AGC}$ remains at a substantially steady level.

Figure 5:
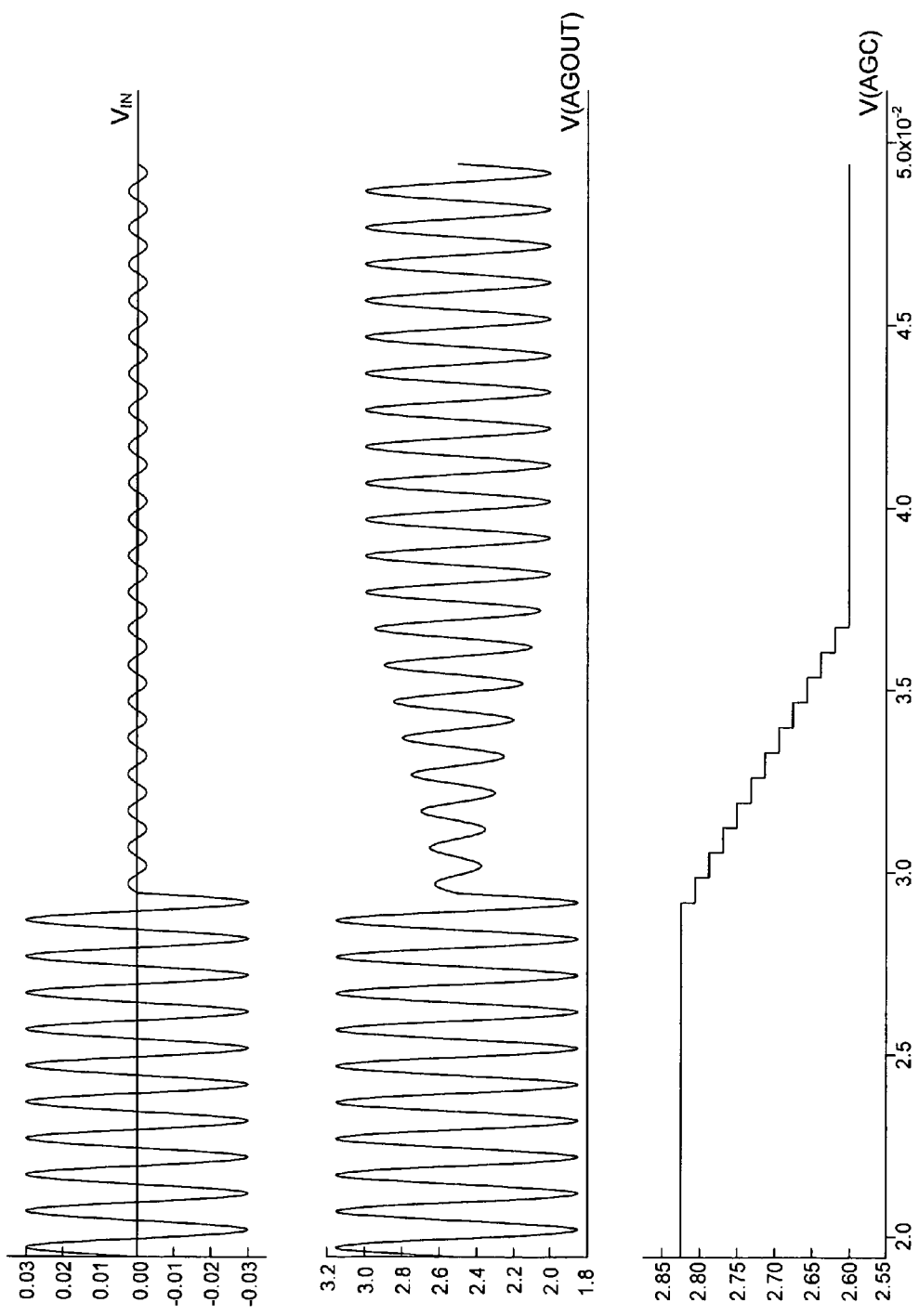
FIG. 5 shows waveforms illustrating decay time response of an automatic gain control circuit in accordance with the present invention.

FIG. 5 shows simulated waveforms illustrating decay time response of an automatic gain control circuit in accordance with the present invention with a $V_{IN}$ frequency of 1 kilohertz in an "release" or "decay" example where $V_{IN}$ decreases from a peak value of about 30 mV to a peak value of about 2.5 mV. In FIG. 5, $V_{AGC}$ generated is illustrated demonstrating how it decreases in a step-wise linear fashion with two increments per clock cycle in the specific implementation. Each increment is substantially equal in magnitude to each other increment, and there is no discernable non-linear decay or discharge that affects the $V_{AGC}$ level. Once the timing controller 203 is deactivated $V_{AGC}$ remains at a substantially steady level. Significantly, the process of reducing the $V_{AGC}$ value shown in FIG. 5 is substantially analogous to the process of increasing $V_{AGC}$ illustrated in FIG. 4.

Figure 6:
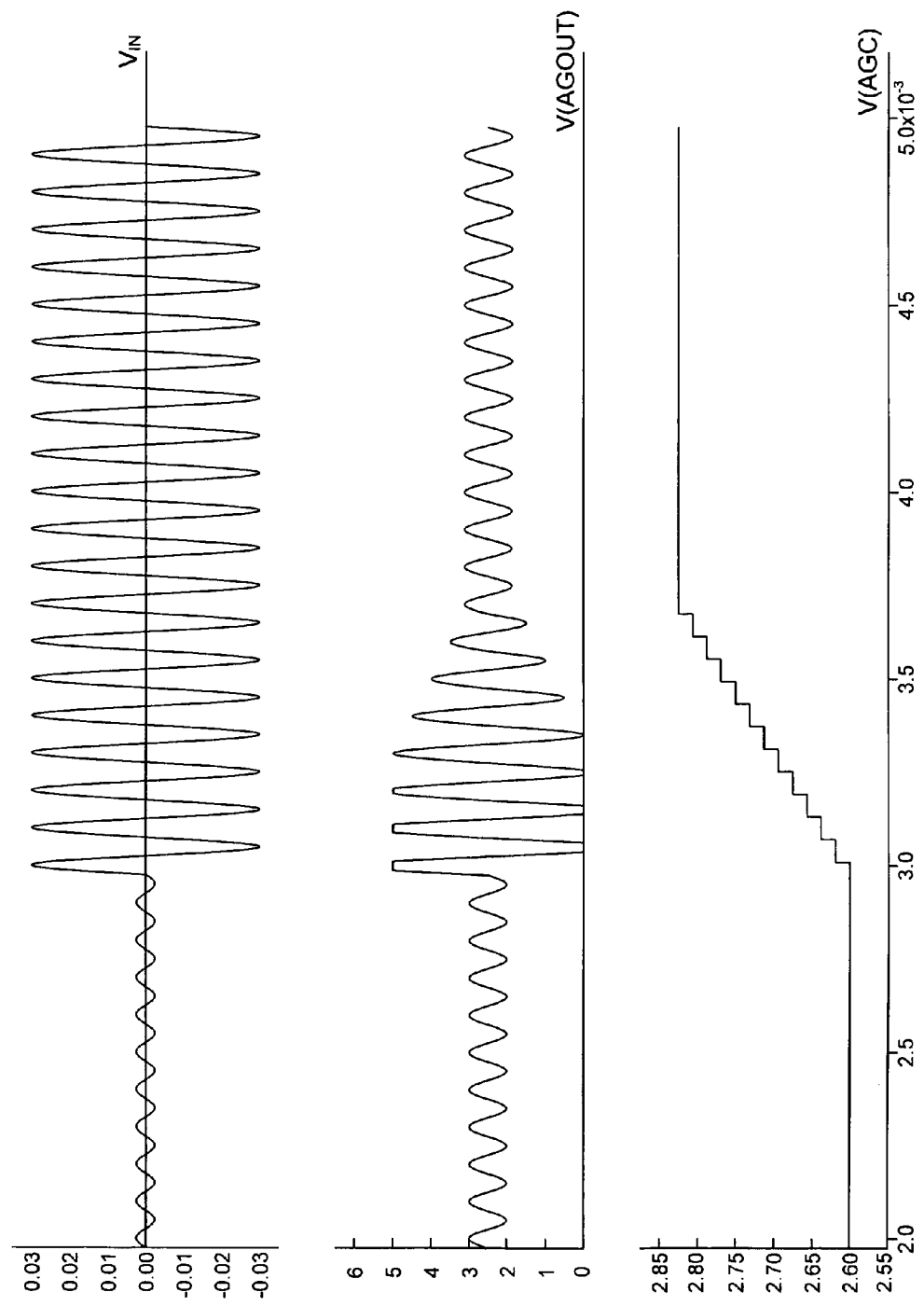
FIG. 6 shows waveforms illustrating attack time response of an automatic gain control circuit in accordance with the present invention at an alternate frequency as compared to the example of FIG. 4.
Figure 7:
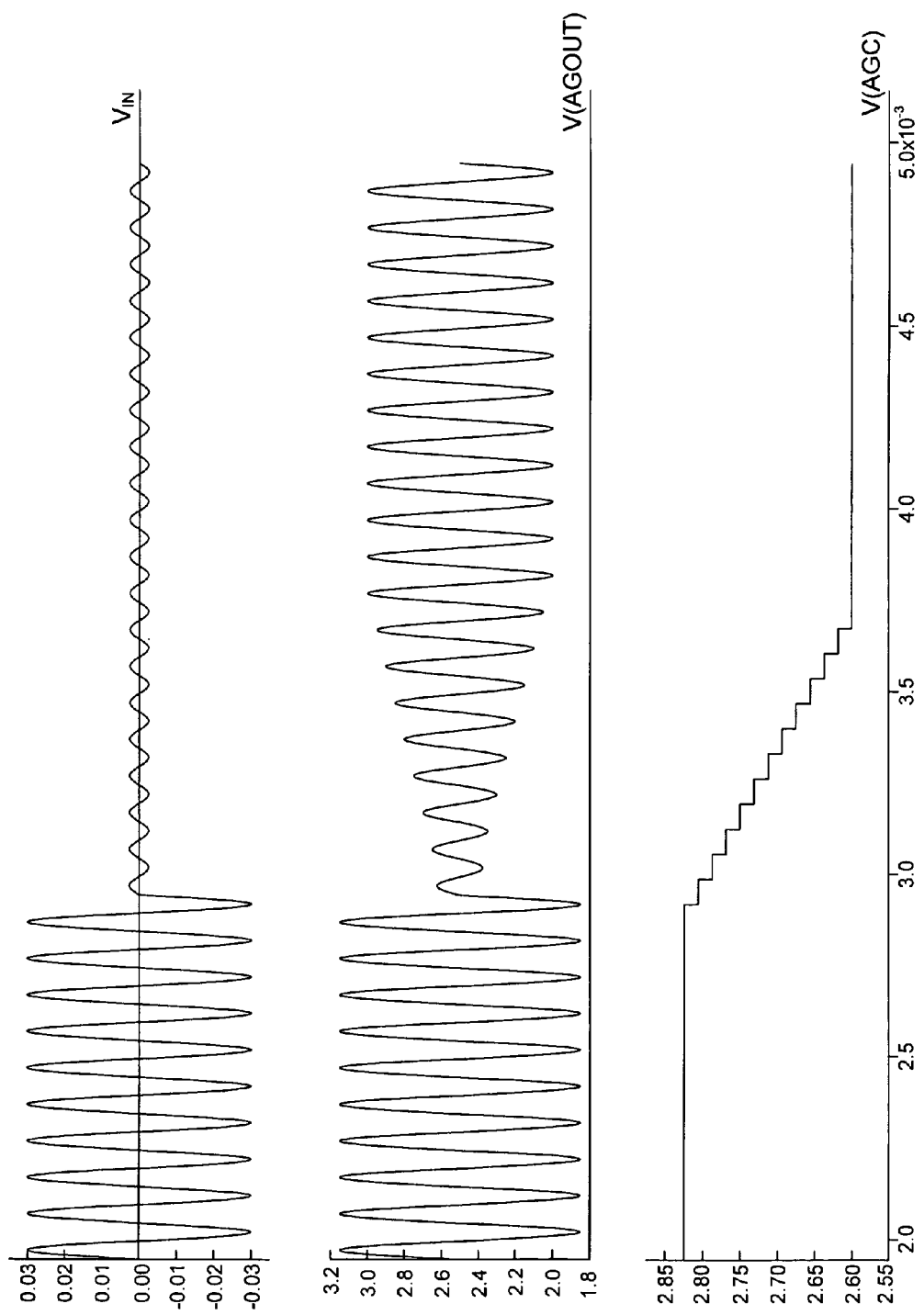
FIG. 7 shows waveforms illustrating decay time response of an automatic gain control circuit in accordance with the present invention at an alternate frequency as compared to the example of FIG. 5.

FIG. 6 and FIG. 7 shows simulated waveforms illustrating attack time response (FIG. 6) and decay time response (FIG. 7) of the automatic gain control circuit in accordance with the present invention at an alternate frequency (10 kilohertz) as compared to the examples of FIG. 4 and FIG. 5. It is apparent that the response times, in terms of signal cycles, are substantially identical. Significantly, the incremental change in $V_{AGC}$ for each signal period is identical to that shown in the 1 kilohertz examples of FIG. 4 and FIG. 5. In the simulated examples, the total attack response time and total delay response time is scaled linearly with frequency, hence, at 10 kilohertz the response times are 10× shorter than the corresponding times for a 1 kilohertz signal. This is preferable in many cases to the prior art situation in which $V_{AGC}$, and hence gain response, increases faster at lower signal frequency than it does at higher input frequencies. However, because the change in $V_{AGC}$ for each T2/T3 pulse is uniform over frequency, it is a simple matter to decrease the frequency of T2/T3 pulses so that the attack/decay response times are substantially similar in an absolute sense (e.g., by adding a divider to the T2/T3 pulse generation circuitry so that only one T2/T3 pulse is generated for every ten signal cycles).

Although the invention has been described and illustrated with a certain degree of particularity, it is understood that the present disclosure has been made only by way of example and that numerous changes in the combination and arrangement of parts can be resorted to by those skilled in the art without departing from the spirit and scope of the invention, as hereinafter claimed.

We claim:

1. A method of gain control, comprising:
amplifying an input signal with a variable gain amplifier to generate an output signal, wherein the gain of the variable gain amplifier is selected based upon a control signal presented at a control input of the variable gain amplifier;
determining when the output signal has a magnitude outside of predetermined upper and lower boundaries;
generating a clock pulse substantially synchronized with the output signal, wherein the generating the clock pulse is performed with a clock generator;
when the output signal is larger than the upper boundary a first pulse is applied to a first switch, incrementally changing the magnitude of the control signal so as to reduce the gain of the variable gain amplifier in a step-wise linear fashion; and
when the output signal is smaller than the lower boundary a second pulse is applied to a second switch, incrementally changing the magnitude of the control signal so as to increase the gain of the variable gain amplifier in a step-wise linear fashion, wherein the first pulse is different from the second pulse and the first pulse comprises a first pulse width and the second pulse comprises a second pulse width that are fixed by the clock pulse.

2. The method of claim 1 wherein the act of incrementally changing the magnitude of the control signal is performed using a charge pump.

3. The method of claim 1 wherein the control signal can be changed so as to increase the gain at a rate that is the same as the rate at which the control signal can be changed so as to decrease the gain.

4. The method of claim 1 wherein the act of incrementally changing the magnitude of the control signal further comprises:

providing a current source having a magnitude that is proportional to a difference between the output signal and a preselected reference voltage; and selectively coupling the current source to a capacitor for a plurality of time increments where each increment supplies substantially equal amounts of charge to the capacitor.

5. The method of claim 1 wherein the act of determining when the output signal has a magnitude outside of predetermined upper and lower boundaries comprises rectifying the output signal and comparing the rectified output signal to at least one predetermined voltage.

6. The method of claim 5 wherein the rectified output voltage is compared to at least three predetermined voltages including a first predetermined voltage that represents a maximum amplitude, a second predetermined voltage that represents a minimum amplitude, and a third predetermined voltage that represents a target amplitude.

7. An integrated circuit implementing the method of claim 1.

8. An integrated circuit implementing the method of claim 2 wherein the charge pump includes a capacitor integrated on the integrated circuit.

9. A system on a chip (SOC) implementing the method of claim 1.

10. A system on a chip (SOC) implementing the method of claim 2 wherein the charge pump includes a capacitor integrated on the integrated circuit.

11. An automatic gain control (AGC) circuit, comprising:
a variable gain amplifier coupled to an input signal generating an output signal, wherein the gain of the variable gain amplifier is selected based upon a control signal presented at a control input of the variable gain amplifier;
a comparator coupled to the output of the variable gain amplifier and operating to determine when the output signal has a magnitude outside of predetermined upper and lower boundaries; and
a clock generator coupled to a timing controller to generate a clock pulse and capable of supplying a clock pulse to the timing controller substantially synchronized with the output signal,
wherein the timing controller is capable of generating a first pulse comprising a first pulse width fixed by the clock generator and the timing controller, the first pulse is applied to a first switch and configured to close the first switch and a second pulse comprising a second pulse width fixed by the clock generator and the timing controller, the second pulse is applied to a second switch and configured to close the second switch, and the timing controller coupled to the comparator and wherein the timing controller is operational to incrementally change the magnitude of the control signal so as to incrementally alter the gain of the variable gain amplifier in a step-wise linear fashion.

12. The circuit of claim 11, further comprising a charge pump to incrementally alter the gain of the variable gain amplifier in a step-wise linear fashion.

13. The circuit of claim 12, wherein the charge pump comprises a first switch coupled to the timing controller to receive the first pulse to activate or deactivate a first variable current source and a second switch coupled to the timing controller to receive the second pulse to activate or deactivate a second variable current source.

14. An automatic gain control (AGC) circuit, comprising:
a variable gain amplifier coupled to an input signal generating an output signal;
a clock generator coupled to the output of the variable gain amplifier to generate a clock pulse substantially synchronized with the output signal;
a comparator coupled to the output of the variable gain amplifier and operating to determine when the output signal has a magnitude outside of predetermined upper and lower boundaries;
a timing controller coupled to the clock generator and the comparator capable of generating a first pulse and second pulse, wherein the clock generator is capable of supplying the clock pulse to the timing controller, and
wherein the first pulse comprises a first pulse width and the second pulse comprises a second pulse width and each width is fixed by the timing controller and the clock generator, and wherein the first pulse is generated when the output signal has a magnitude outside the predetermined upper boundary and the second pulse is generated when the output signal is outside the predetermined lower boundary; and
a charge pump coupled to the timing controller and the variable gain amplifier, wherein the charge pump is driven by the timing controller to incrementally change the magnitude of the control signal so as to incrementally alter the gain of the variable gain amplifier in a step-wise linear fashion,
wherein the charge pump comprises a first switch coupled to the timing controller to receive the first pulse to activate or deactivate a first variable current source and a second switch coupled to the timing controller to receive the second pulse to activate or deactivate a second variable current source.

15. The circuit of claim 14, wherein the control signal can be changed so as to increase the gain at a rate that is the same as the rate at which the control signal can be changed so as to decrease the gain.

16. The circuit of claim 14, wherein the charge pump comprises a capacitor integrated on an integrated circuit.

17. The circuit of claim 14, further comprising a buffer coupled to the variable gain amplifier and the charge pump.

18. The circuit of claim 14, further comprising a rectifier to rectify the output signal and compare the rectified output signal to at least one predetermined voltage.

19. The circuit of claim 18, wherein the comparator compares the rectified output signal to at least three predetermined voltages including a first predetermined voltage that represents a maximum amplitude, a second predetermined voltage that represents a minimum amplitude, and a third predetermined voltage that represents a target amplitude.

* * * * *

UNITED STATES PATENT AND TRADEMARK OFFICE
CERTIFICATE OF CORRECTION

PATENT NO. : 7,869,549 B2  Page 1 of 1
APPLICATION NO. : 11/115437
DATED : January 11, 2011
INVENTOR(S) : Fang Yang and Shunbai Tang It is certified that error appears in the above-identified patent and that said Letters Patent is hereby corrected as shown below:

Column 6, line 43, after "signal" add --and supplying the clock pulse to a timing controller--

Column 6, line 46, after "pulse" add --generated in the timing controller--

Column 6, line 46, after "switch" add --to close the switch--

Column 6, line 51, after "is" add --generated in the timing controller and--

Column 6, line 51, after "switch" add --to open the switch--

Column 6, line 54, delete ", wherein the first pulse is different from the second pulse and the first pulse comprises a first pulse width and the second pulse comprises a second pulse width that are fixed by the clock pulse"

Signed and Sealed this
Fifth Day of April, 2011

David J. Kappos
*Director of the United States Patent and Trademark Office*